US009195594B2

(12) United States Patent
Cohen

(10) Patent No.: US 9,195,594 B2
(45) Date of Patent: Nov. 24, 2015

(54) LOCATING DATA IN NON-VOLATILE MEMORY

(71) Applicant: LSI CORPORATION, San Jose, CA (US)

(72) Inventor: Earl Cohen, Oakland, CA (US)

(73) Assignee: Seagate Technology LLC, Longmont, CO (US)

( * ) Notice: Subject to any disclaimer, the term of this patent is extended or adjusted under 35 U.S.C. 154(b) by 9 days.

(21) Appl. No.: 13/962,558

(22) Filed: Aug. 8, 2013

(65) Prior Publication Data

US 2014/0208061 A1 Jul. 24, 2014

Related U.S. Application Data

(60) Provisional application No. 61/782,089, filed on Mar. 14, 2013, provisional application No. 61/755,169, filed on Jan. 22, 2013.

(51) Int. Cl.
*G06F 12/00* (2006.01)
*G06F 12/04* (2006.01)
*G06F 12/02* (2006.01)

(52) U.S. Cl.
CPC ............ *G06F 12/04* (2013.01); *G06F 12/0246* (2013.01)

(58) Field of Classification Search
None
See application file for complete search history.

(56) References Cited

U.S. PATENT DOCUMENTS 8,019,925 B1 9/2011 Vogan et al.
2011/0283048 A1 11/2011 Feldman et al.

*Primary Examiner* — Kevin Verbrugge
(74) *Attorney, Agent, or Firm* — Duft Bornsen & Fettig LLP; Gregory T. Fettig

(57) ABSTRACT

Systems and methods presented herein provide for locating data in non-volatile memory by decoupling a mapping unit size from restrictions such as the maximum size of a reducible unit to provide efficient mapping of larger mapping units. In one embodiment, a method comprises mapping a logical page address in a logical block address space to a read unit address and a number of read units in the non-volatile memory. The method also comprises mapping data of the logical page address to a plurality of variable-sized pieces of data spread across the number of read units starting at the read unit address in the non-volatile memory.

22 Claims, 9 Drawing Sheets

LOCATING DATA IN NON-VOLATILE MEMORY

CROSS REFERENCE TO RELATED APPLICATIONS

This patent application claims priority to, and thus the benefit of an earlier filing date from, U.S. Provisional Patent Application Nos. 61/782,089 (filed Mar. 14, 2013) and 61/755,169 (filed Jan. 22, 2013), the entire contents of each of which are hereby incorporated by reference.

FIELD OF THE INVENTION

The invention generally relates to non-volatile memory and more particularly to the location of data in the non-volatile memory.

BACKGROUND

Fewer writes to a non-volatile memory improves performance and longevity of the non-volatile memory. Accordingly, data compression is used to reduce the size of data written to the non-volatile memory such that less space is required for the data (e.g., less space results in fewer writes). But, the variable-sized nature of compressed data impacts a mapping layer of the non-volatile memory because it is forced to map host Logical Block Addresses (LBAs) to variable-sized chunks or "pieces" of data to physical locations in the memory, rather than fixed-sized pieces. More specifically, read-modify-write operations to the non-volatile memory are affected because the LBAs are not aligned with "mapping unit" boundaries.

SUMMARY

Systems and methods presented herein provide for locating data in non-volatile memory by decoupling a mapping unit size from restrictions such as the maximum size of a "reducible unit" to provide efficient mapping of larger mapping units. In this regard, multiple logical blocks may be aggregated into a larger "mapping unit" which reduces a size of a mapping layer of the non-volatile memory (e.g., a Flash Translation Layer of an SSD). In one embodiment, a method comprises mapping a logical page address in a logical block address space to a read unit address and a number of read units in the non-volatile memory. The method also comprises mapping data of the logical page address to a plurality of variable-sized pieces of data spread across the number of read units starting at the read unit address in the non-volatile memory.

The various embodiments disclosed herein may be implemented in a variety of ways as a matter of design choice. For example, the system and method embodiments hereof may take the form of computer hardware, software, firmware, or combinations thereof. Other exemplary embodiments are described below.

BRIEF DESCRIPTION OF THE FIGURES

Some embodiments of the present invention are now described, by way of example only, and with reference to the accompanying drawings. The same reference number represents the same element or the same type of element on all drawings.

DETAILED DESCRIPTION OF THE FIGURES

The figures and the following description illustrate specific exemplary embodiments of the invention. It will thus be appreciated that those skilled in the art will be able to devise various arrangements that, although not explicitly described or shown herein, embody the principles of the invention and are included within the scope of the invention. Furthermore, any examples described herein are intended to aid in understanding the principles of the invention and are to be construed as being without limitation to such specifically recited examples and conditions. As a result, the invention is not limited to the specific embodiments or examples described below.

Figure 1:
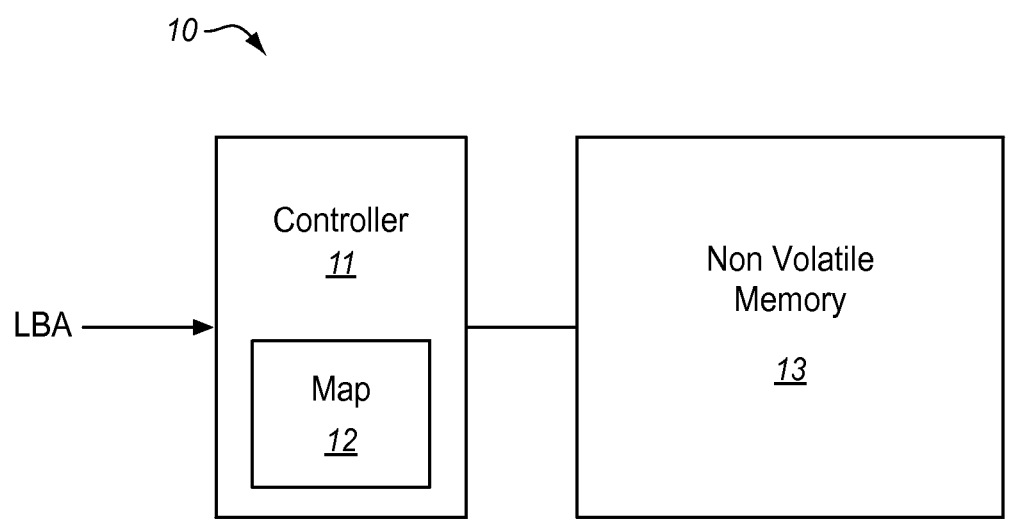
FIG. 1 is a block diagram of an exemplary system for locating data in non-volatile memory.

FIG. 1 is a block diagram of an exemplary system 10 for mapping and locating data in a non-volatile memory 13. The system includes a controller 11 and a non-volatile memory 13 (e.g., an SSD). The controller 11 is operable to map between host logical block addresses (LBAs) and physical locations in a non-volatile memory via a map 12 of variable-sized mapping units. To illustrate, a reducible unit is the amount of data that reduction/compression hardware can operate on at one time. The system 10 is operable to combine multiple reducible units into variable-sized mapping units that map the host LBAs to physical locations in a non-volatile memory without regard to the size of the reducible unit.

With variable-sized mapping units, the system 10 allows for more flexible data reduction/compression hardware because the data reduction/compression hardware can operate on a single, fixed size of data and/or on a determined maximum size of data. The system 10 also provides greater scalability in the size of the mapping unit, since the size of the mapping unit is no longer limited to being no more than the largest size that the data reduction hardware is able to process. Additional details regarding the operation of the system 100 are now described with respect to FIG. 2.

Figure 2:
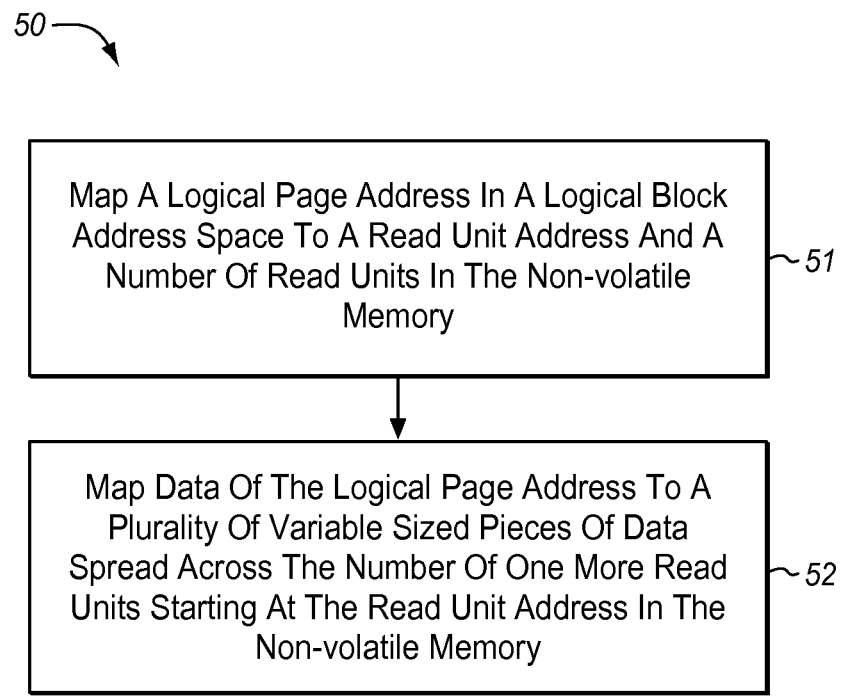
FIG. 2 is a flowchart of an exemplary process of the system of FIG. 1.

FIG. 2 is a flowchart 50 of an exemplary process of the system 100 of FIG. 1. In this embodiment, the controller 11 maps a logical page address in a logical block address space to a read unit address and a number of read units in the non-volatile memory 13, in the process element 51. For example, a logical page in the non-volatile memory comprises a number of read units located at a particular physical address in the in the non-volatile memory 13. A read unit is generally the smallest quantity of correctable data readable from the non-volatile memory 13 and comprises bytes of user data and error correction code (ECC) check bytes. Typical sizes for the user data bytes of a read unit include 512B, 1 KB, 2 KB, etc. (including sizes that are not a power of two). Typical sizes for the ECC check bytes of one read unit vary depending on a type of non-volatile memory being used, a number of read units in each page of the non-volatile memory 13, and the user data size of each of the read units.

With data compression, each read unit may comprise less than one, one, or more than one (including fractional portions) of the aforementioned reducible units. The controller 11 via the map 12 maps the addresses of each of these reducible units to its corresponding logical page address in the non-volatile memory 13. In this regard, the controller 11 also maps the data of the logical page address to a plurality of variable-sized pieces of data spread across the number of read units starting at the read unit address in the non-volatile memory, in the process element 52.

Figure 3:
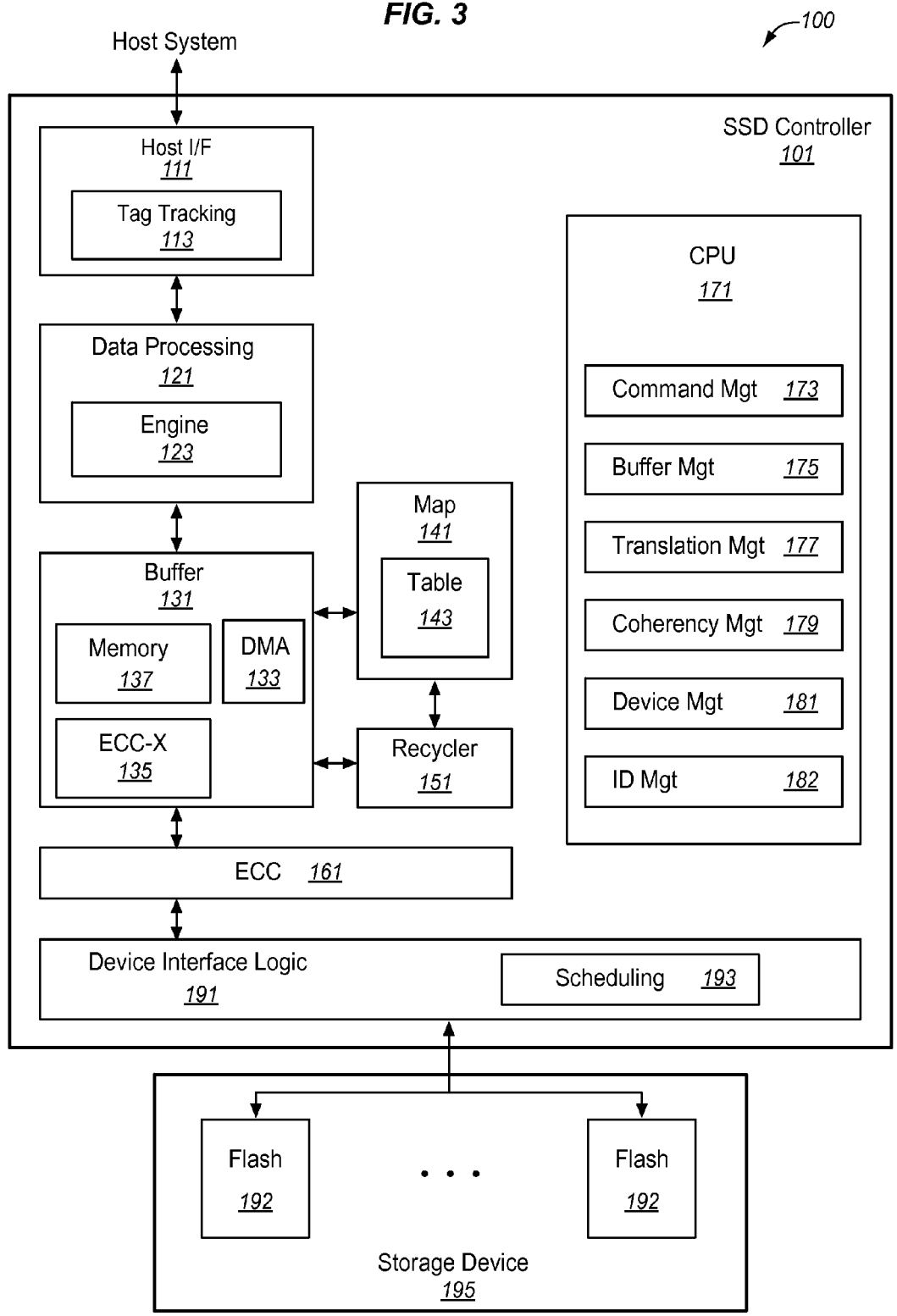
FIG. 3 is a block diagram of an exemplary storage controller and its associated storage device.
Figure 4:
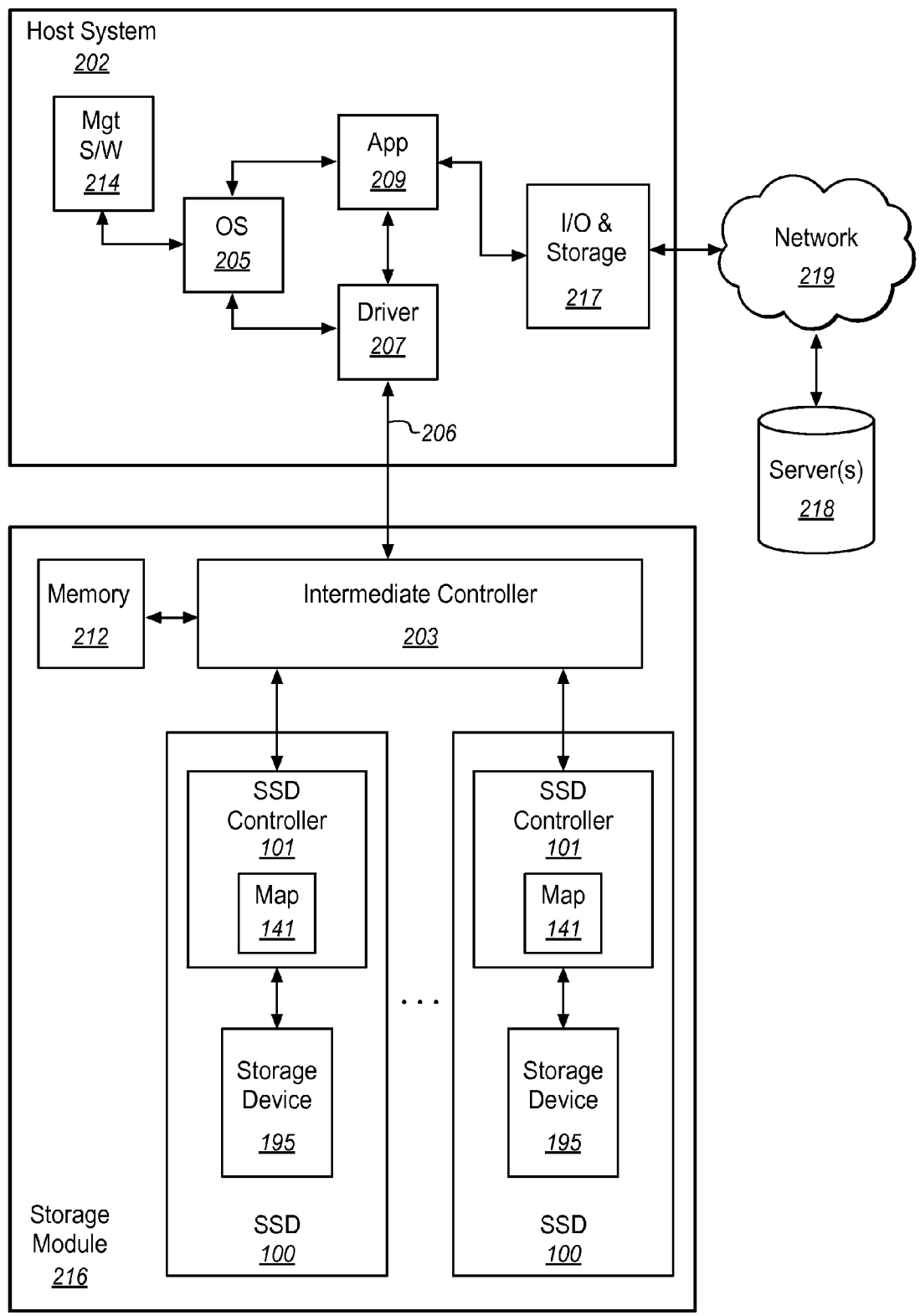
FIG. 4 is a block diagram of an I/O module comprising SSDs and their associated controllers/storage devices interfacing with a host system.

While one form of mapping has been illustrated with the exemplary system 10, other exemplary embodiments shown and described below may provide additional details regarding such mapping. Also, the invention can take the form of an entirely hardware embodiment, an entirely software embodiment, or an embodiment containing both hardware and software elements. FIGS. 3 and 4 illustrate a combination of hardware and software embodiments that may be operable to employ the systems and methods described herein. More specifically, FIG. 3 is a block diagram of an exemplary SSD 100 and its associated device controller (i.e., SSD controller 101) and storage device 195 (e.g., non-volatile memory 13 of FIG. 1). FIG. 4 is a block diagram of a storage module 216 comprising SSDs 100 and their associated controllers 101/ storage device 195 interfacing with a host system 202.

In FIG. 3, the SSD controller 101 includes a host interface 111 that is operable to interface with a host system to communicate I/O operations of the host system. The host interface 111 may be configured with a tag tracking module 113 that is operable to track progress of individual I/O commands (e.g., read and write commands to certain addresses in the storage device 195). The tag tracking module 113 may associate an external flag of a command received from the host system with an internal flag that the SSD controller 101 can access during processing of the command to identify the status of the processing.

The SSD controller 100 also includes a data processing module 121 that comprises a processing engine 123 is generally operable to perform certain tasks on data that is received from the host interface 111 or residing within a buffer 131, such as one or more of formatting the data, transcoding the data, compressing the data, decompressing the data, encrypting the data, decrypting the data, any other data encoding or formatting, or any combination of the foregoing. For example, a processing engine 123 of the data processing module 121 may be operable to process the I/O operation from an I/O module of the host system generating the operation, such that the data of the I/O operation may be written to the logical address of the storage device 195. The processing engine 123 may extract the data of the write I/O command and prepare it for storage in the storage device 195. In doing so, the processing engine 123 may compress the data using any of a variety of data compression algorithms. When retrieving the data from the storage device 195, the processing engine 123 may decompress the data according to the algorithm used to compress the data for storage.

The buffer 131 is operable to store data transferred to and from the host system. The buffer 131 may also store system data, such as memory tables used by the SSD controller 101 to manage one more of the individual flash devices 192 and higher-level RAID functionality in the memory 137. Other modules may include an error correcting code (ECC-X) module 135 to provide higher-level error correction and redundancy functionality, and a Direct Memory Access (DMA) module 133 to control movement of data to and from the buffer 131.

The SSD controller 101 also includes an error correction code module 161 operable to provide lower level error correction and redundancy processing of the data in the buffer 131 using any of a variety of error correction codes techniques (e.g., cyclic redundancy checks, Hamming codes, low-density parity check coders, etc.).

A device interface logic module 191 is operable to transfer data to and from the individual flash devices 192 according to the protocol of the flash device 192. The device interface logic module 191 includes a scheduling module 193 that is operable to queue I/O operations to the flash devices 192.

The SSD controller 101 herein also includes a map module 141 that is operable to perform data addressing to locations in the storage device 195 according to a table 143. For example, the map module 141 may use the table 143 to convert logical block addresses (LBAs) from the host system to block/page addresses directed to one or more of the individual flash devices 192. Table 143 may be stored in whole or in part in SSD controller 101 and/or in storage device 195. For example, in some embodiments a portion of table 143 is cached in SSD controller 101 with generally all of table 143 being stored non-volatilely in storage device 195.

A recycler 151 performs garbage collection on behalf of the SSD controller 101. For example, the recycler 101 may determine portions of the flash devices 192 that are actively in use by scanning the table 143 of the map module 141. In this regard, the recycler 151 may make unused, or "deallocated", portions of the flash devices 192 available for writing by erasing the unused portions. The recycler 151 may also move data within the flash devices 192 to make larger contiguous portions of the flash devices 192 available for writing.

The SSD controller 101 also includes a CPU 171 that controls various aspects of the SSD controller 101. For example, the CPU 171 may process instructions or firmware to implement command management 173 that tracks and controls commands received from the host system. This firmware may also implement buffer management 175 that controls allocation and use of the buffer 131 and translation management or 177 to control the map module 141. The firmware may also employ coherency management 179 to control consistency of data addressing to avoid conflicts such as those that may occur between external data accesses and recycled data accesses. The firmware may also provide device management 181 to control the device interface logic 191 and identity management 182 to control modification and communication of identity information of components within the SSD controller 101.

In FIG. 4, the host system 202 is operable to process software instructions and perform I/O operations with the storage module 216 to read from and write to one or more SSDs 100. In this regard, the host system 202 may include an operating system 205 that provides the computing environment for the host system 202. A driver 207 is operable to communicate through the link 206 to the storage module 216 to perform the I/O operations with the various SSDs 100 configured therewith.

Like other computing systems, the operating system 205 may be initiated via management software 214 (e.g., Bios software). The host system 202 may also include application software 209 to perform various computing processes on behalf of the host system 202 (e.g., word processing applications, image processing applications, etc.). The host system 202 may also include I/O and storage functionality 217 operable to conduct I/O operations with one or more servers 218 through a communication network 219 (e.g., the Internet, local area networks, wide-area networks, etc.). In this regard, the storage module 216 may act as a cache memory of I/O operations for the host system 202.

The storage module 216 may be configured with an intermediate controller 203 that is operable to switch various I/O operations of the host system 202 to LBAs of the SSDs 100.

In this regard, the storage module 216 may include a memory 212 that stores mapping information for the intermediate controller 203 to conduct the I/O operations to the LBAs.

As mentioned, the map module 141 of the SSD controller 101 is operable to perform data addressing with variable-sized mapping units to locations in the storage device 195 according to a table 143, converting LBAs from the host system 202 to block/page addresses directed to one or more of the individual flash devices 192 of the storage device 195. FIGS. 5-8 provide some context for such mapping with a specific example of the mapping being illustrated in FIGS. 9 and 10.

Figure 5:
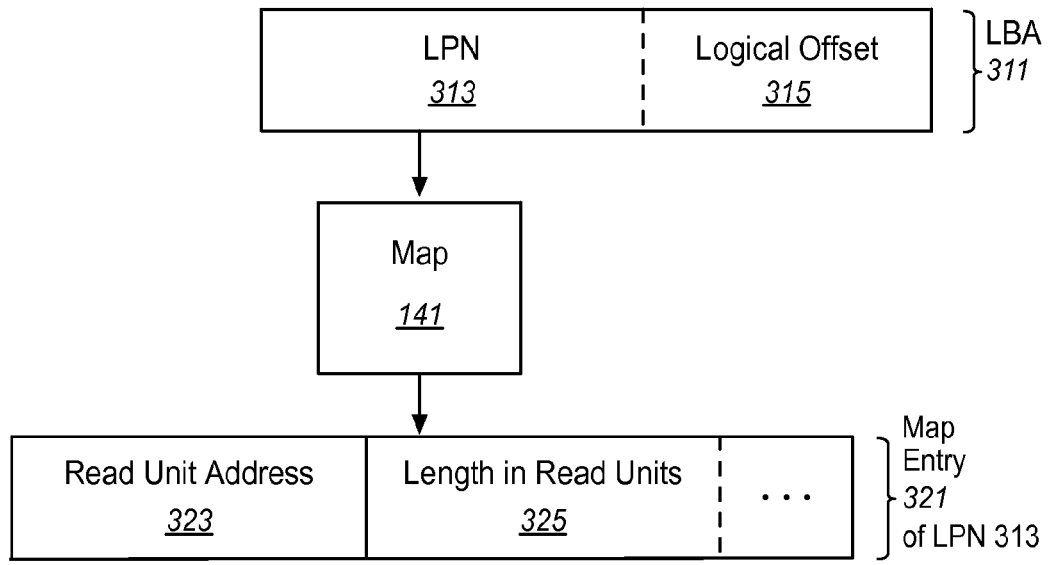
FIGS. 5-10 are block diagrams of exemplary data structures and maps to data in non-volatile memory.

In FIG. 5, a Logical Page Number (LPN) 313 is mapped by looking up the LPN 313 in the map 141 to find an associated map entry 321 in the table 143 that provides information relating to a physical location of corresponding data of the LPN 313 in the storage device 195 of the SSD 100, such as the read unit address 323 and the length in read units 325. The LPN 313 is determined from the logical block address 311, such as provided by the host system 202. For example, with a power-of-two number of logical blocks per logical page, in some embodiments, the LPN 313 is the most-significant bits of the logical block address 311.

Generally, a plurality of read units exists with each page of the storage device 195. For example, a non-volatile memory page may include 16 KB of user data plus "spare" bytes used for error correction. Each read unit may comprise 2 KB for user data (⅛th of the user portion of the page of the non-volatile memory) plus a portion of the "spare" bytes for error correction of that portion. The layout of read units in a page of the storage device 195 does not require the separation of the user bytes and ECC check bytes of one read unit. Rather, the entire page of the storage device 195 including the spare bytes may be divided into "n" adjacent pieces to form "n" read units (where "n" simply represents an integer greater than zero and not necessarily equal to any other "n" representation herein). A portion of the page may even be unused (e.g., when a total number of bytes in the page is not divisible by "n" or by "2n").

The map entry 321 of the map 141 includes the length in a fixed-granularity unit, such as 1B, 64B, 512B, or 2 KB, specifying the length of the variable-sized piece of data stored in the storage device 195. This fixed-granularity length may be used for tracking an amount of used space in various portions of the storage device 195. For example, when a variable-sized piece of data is written to a first portion of the storage device 195, a used length for the first portion of the storage device 195 is incremented by the fixed-granularity length of the variable-sized piece of data. The fixed-granularity length is also stored in the map entry 321 of the variable-sized piece of data. Afterwards, when the variable-sized piece of data is written a second time to a new portion of the storage device 195 and with a new fixed-granularity length (i.e., thereby rendering the previous location in the first portion of the storage device 195 obsolete), the fixed-granularity length stored in the map entry 321 of the variable-sized piece of data is used to decrement the used length for the first portion of the storage device 195 to accurately account for the formerly used space.

Figure 6:
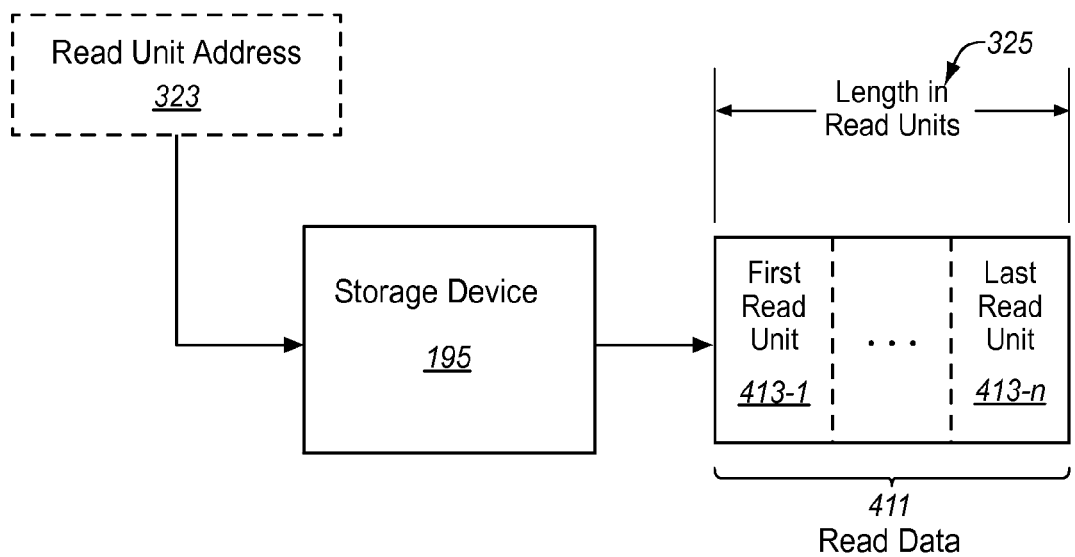

Variable-sized data is located in the storage device 195 using the map entry 321, as illustrated in FIG. 6. The read unit address 323 refers to a first read unit 413-1 in one page of the storage device 195, and the length 325 in read units specifies a number of sequential read units 413 that reside in different or same pages of the storage device 195. The desired variable-sized data may start in a last read unit 413 of one page of the storage device 195 and continue into a first read unit 413 of a next page of the storage device 195. In some embodiments, an order of writing to the storage device 195 is such that read units 413 from multiple pages of the storage device 195 are filled with write data prior to completely filling any one of the pages of the storage device 195. In various embodiments, other orders of writing to the storage device 195 are used, such as filling one page with multiple read units prior to writing into other pages. Accordingly, subsequent read units 413 may be located in different pages of the storage device 195.

Figure 7:
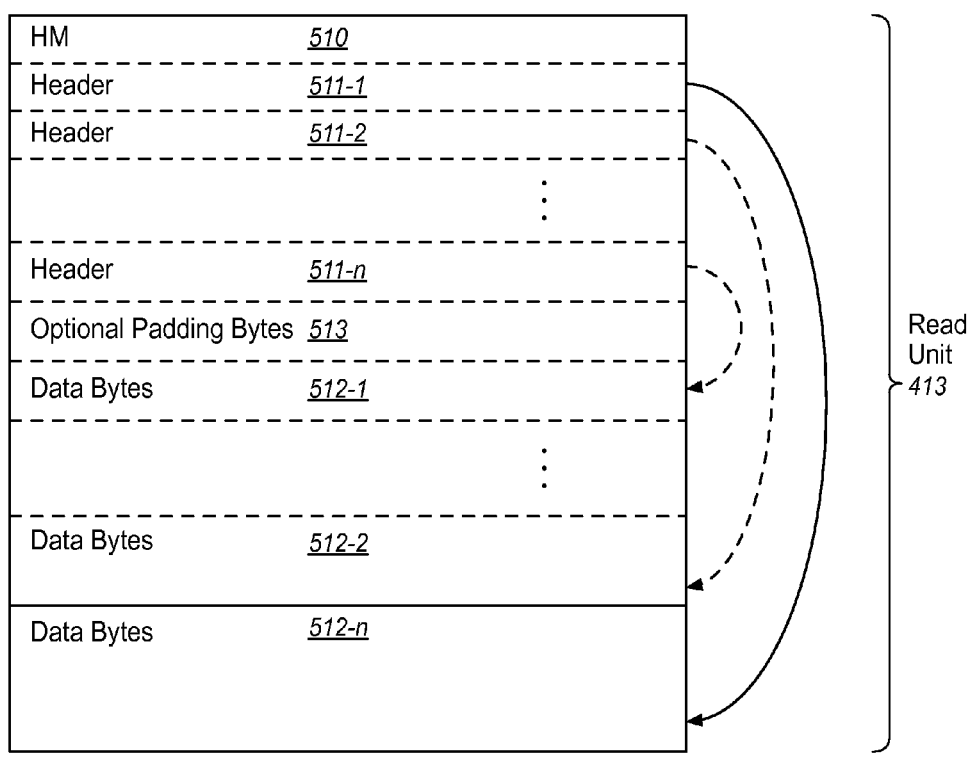

As illustrated in FIG. 7, headers of a read unit 413, such as headers 511-1-511-$n$, are operable to identify one or more variable-sized pieces of data (e.g., 512-1-512-$n$, respectively) in any given read unit 413. A variable-sized piece of data can start in a first read unit 413 and end in the first read unit 413 (e.g., possibly not completely filling the first read unit 413). Or, the variable-sized piece of data can finish filling a first read unit 413, completely fill zero or more subsequent read units 413, and end in a final read unit 413 (e.g., possibly without completely filling the final read unit 413). In other words, variable-sized data can be spread across any number of fixed-size read units 413, including across multiple logical pages of the storage device 195.

An optional header marker 510 can be used to indicate a number of following contiguous headers. Optional padding bytes 513 can also be used to occupy remaining space of a read unit 413. For example, when a variable-sized piece of data ends within a read unit 413, but a remaining number of bytes in the read unit is not sufficient to store a header 511, padding bytes 513 are used so that the read unit is a specified total size.

Retrieving a variable-sized piece of data from storage device 195 may require certain information in the header 511, including the length in bytes of the variable-sized piece of data (if not stored in byte granularity in map 141), and knowledge of the user data size of each read unit 413. For example, a read units 413 can be configured to have a same user data size or a size that varies between multiple read units 413. Such may occur when enabling different error correction strengths in different blocks of the storage device 195.

Figure 8:
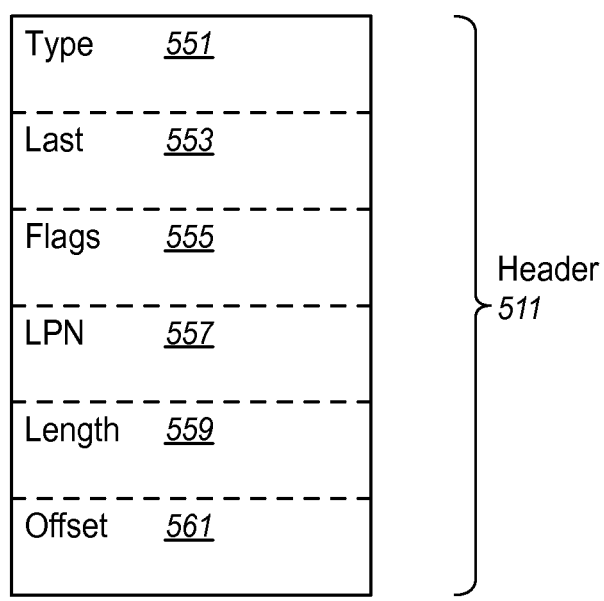

FIG. 8 illustrates one example of the header 511 of a read unit 413. The header 511 can include an offset 561 that "points" to a position within a read unit 413 to locate a start and/or an end of the desired data bytes 512. The length 559 provides a byte length of the desired data and the LPN 557 allows the SSD controller 101 to find data bytes 512 of a desired LPN within a given read unit 413. The type 551 identifies a category of the data bytes 512 (e.g., host data or system data). The last indicator 553 is an alternative, in some embodiments, to header marker 510 and indicates a last one of a series of headers. Flags 555 is optionally and/or selectively used, in various embodiments, to indicate a type and/or a status of the desired data, such as whether the data was compressed, information needed to decompress the data, etc.

By including the length in bytes of the variable-sized piece of data in the header 511 in the read unit 413 instead of (or in addition to) the map entry 321 corresponding to the LPN 313, data is recoverable without the presence of the map 141. This also keeps the map entries smaller, keeping the map 141 more efficient. The fixed-granularity length in the map 141 is used for space-accounting purposes and generally does not require a byte granularity, thereby saving space in each map entry 321.

In some embodiments, it is desirable to remove dependencies between a size of a mapped unit (e.g., a logical page) and a maximum size of a unit that is compressible by data processing module 121 of SSD controller 100. For example, it is desirable to use 8 KB logical pages for efficiency of host operations, but the data processing module 121 is operable to compress 4 KB at a time—each logical page needs to map to two, variable-sized pieces (corresponding to compressed version of each 4 KB half of the 8 KB logical page). In these embodiments, a logical page comprises a specified number ("n") of variable-sized (optionally compressed) pieces of data. Advantageously, the data processing module 121 is limited in a maximum size of data on which it must operate, and further, the host system 502 is enabled to read individual ones of the variable-sized pieces of data without requiring data processing module 121 to decompress the entire logical page.

To accommodate the "n" variable-sized pieces of data, each map entry 321 is changed so that the mapped unit refers to "n" variable-sized pieces of data. By arranging the read units 413 being used to retrieve the mapping unit in a sequential or otherwise identifiable order, a single read unit address can be used. Each variable-sized piece of data can span one or more of the read units 413. A first one of the "n" variable-sized pieces of data and a subsequent one of the "n" variable-sized pieces of data may start and/or end in a same read unit 413. For example, if a first one of the "n" variable-sized pieces of data ends in a read unit 413 which is then full, then the next one of the "n" variable-sized pieces of data starts in a subsequent read unit 413. But if the first variable-sized piece of data ends in a read unit 413 without having completely filled the read unit 413, the next variable-sized piece of data can start in the same read unit 413. An example of such is shown is FIG. 9. Of course, this does not preclude the use of padding to fill the remainder of the read unit 413.

Figure 9:
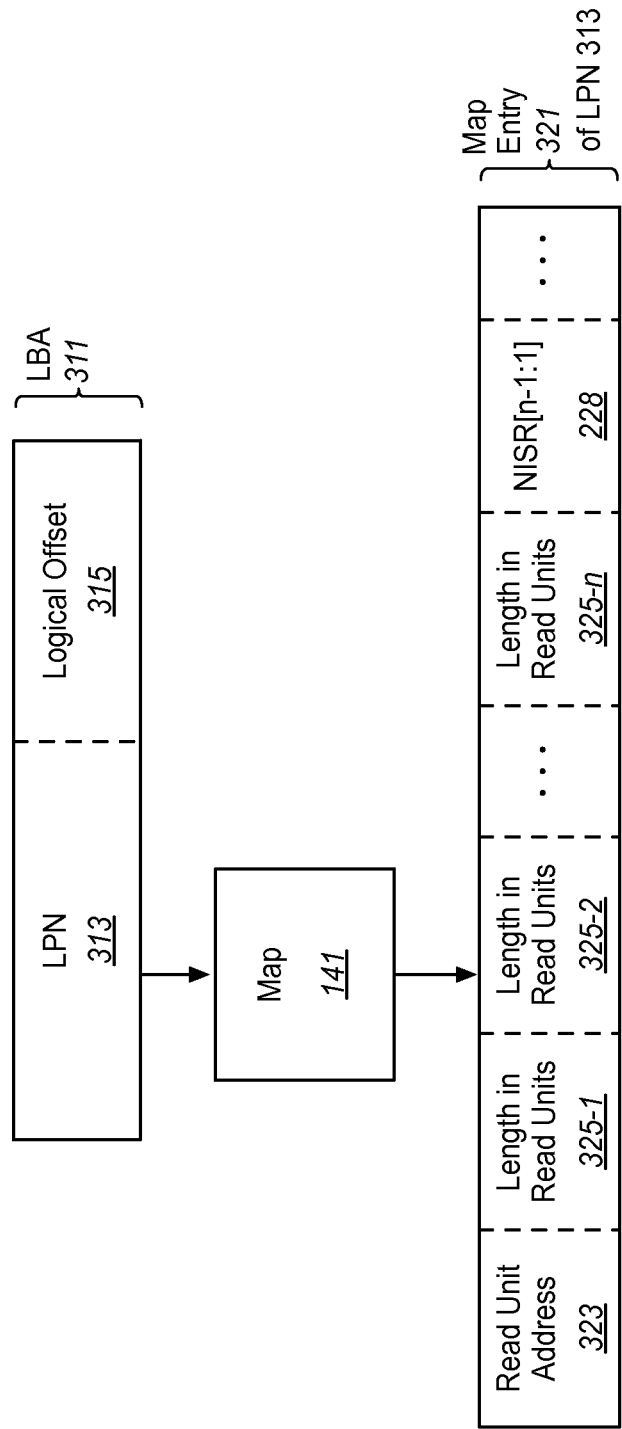

In FIG. 9, each map entry 321 may be encoded to comprise a single read unit address 323, a plurality of lengths in read units 325 of respective variable-sized pieces of data, and one or more "Next In Subsequent Read" unit (NISR) bits 328. There is one length 325 for each of the variable-sized pieces of data in the logical page, and there is one less NISR bit than the number of variable-sized pieces of data.

While the additional NISR bits 228 may increase the size of each map entry 321, doubling, for example, the size of the mapping unit essentially halves a total number of map entries 321. Thus, the storage requirements of the map 141 are substantially reduced. It should be noted that read unit address 323 is generally larger than any one of the lengths 325 in read units. Thus, the larger mapping unit also saves significant space by reducing a number of read unit addresses 323 used to map the entire space of the host LBA 311.

Figure 10:
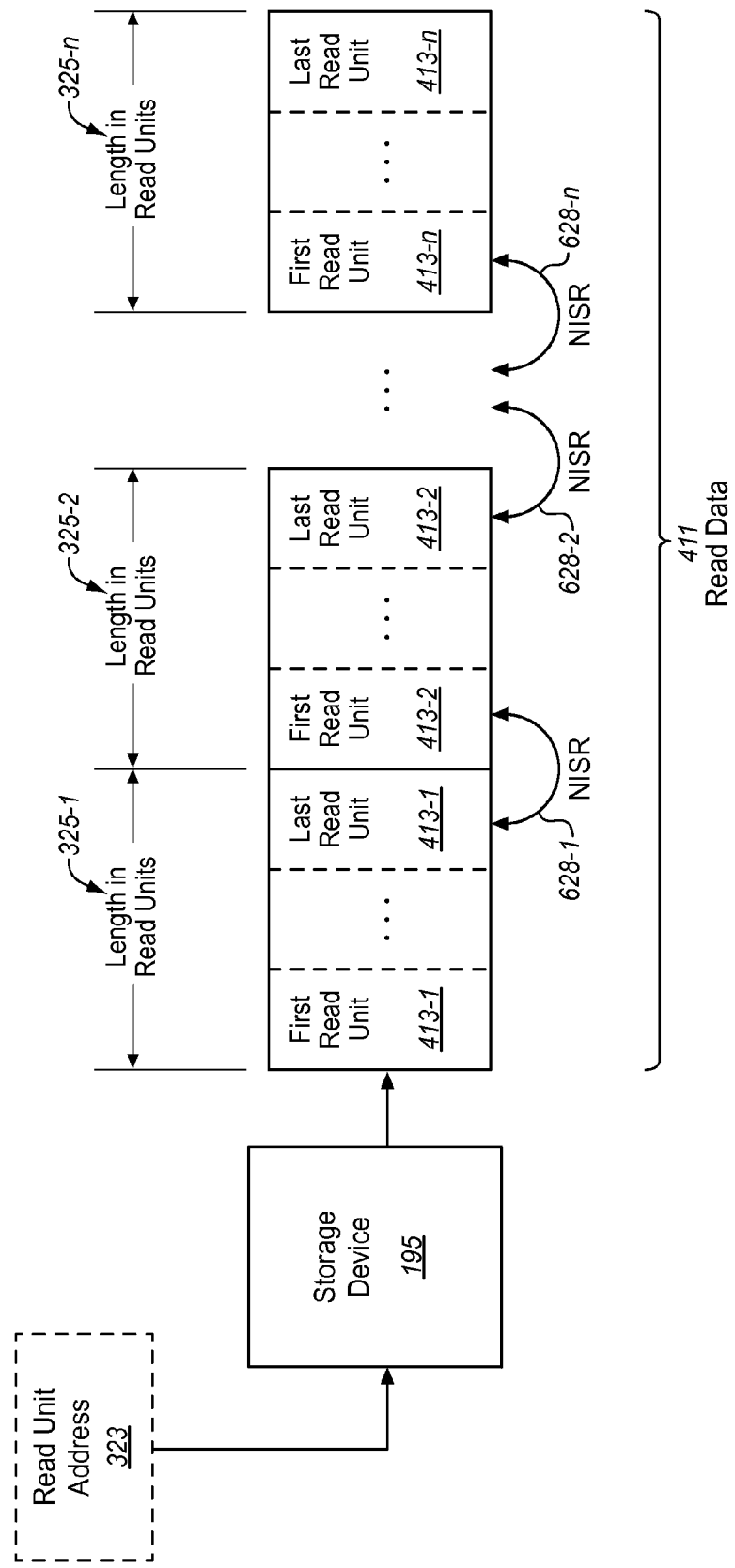

When map entries 321 comprise a fixed-granularity length specifying a length of the mapping unit (e.g., as stored in the storage device 195), a number of bits used to store the fixed-granularity length is increased so that the fixed-granularity length specifies a total length of all of the variable-sized pieces of data used to store the mapping unit. This also reduces the amount of space required for the map 141 because doubling the size of the mapping unit, for example, uses only one more bit in the fixed-granularity length (e.g., as compared to two map entries 321 each having a separate fixed-granularity length). FIG. 10 illustrates usage of a mapping unit specifying read unit locations of "n" variable-sized pieces of data.

In FIG. 10, there are "n" lengths in read units 413, one for each "n" variable-sized piece of data, and "n−1" NISR bits 628. The read unit address 323 identifies a first read unit 413-1 of the mapping unit. The first one of the "n" variable-sized pieces of data is located by the read unit address 323 and the first length 325-1 in read units. The first variable-sized piece of data ends in a read unit 413 specified by the read unit address 323 plus the first length 325-1 in read units minus one. The second one of the "n" variable-sized pieces of data is located via the last read unit 413-1 of the first variable-sized piece of data and the corresponding first NISR bit 628-1. According to the first NISR bit 628-1, the second variable-sized piece of data either starts in a same read unit 413 where the first variable-sized piece of data ends (i.e., in 413-1), or in a subsequent read unit 413 (i.e., 413-2). The same procedure identifies a starting read unit 413 of each remaining variable-sized piece of data in the mapping unit according to a respective NISR bit 628; when a next one of the "n" variable-sized pieces of data starts in a same read unit 413 as a previous one of the "n" variable-sized pieces of data ends; or in a subsequent read unit 413. The last one of the "n" variable-sized pieces of data does not employ a NISR bit 628 because there is no subsequent variable-sized piece of data remaining.

As an example, assume the encoding of the NISR bits is such that '0' encodes that a subsequent variable-sized piece of data starts in a same read unit as a previous variable-sized piece of data ends, and '1' encodes that the subsequent variable-sized piece of data starts in a next read unit after the previous variable-sized piece of data ends. Then a total number of read units needed to retrieve the logical page is equal to the sum of the lengths in read units 325, plus the sum of the NISR bits, minus n−1. For example, if the NISR bits are all 1, then the total number of read units needed to retrieve the logical page is equal to the sum of the lengths in read units 325, since each variable-sized piece of data starts in a subsequent read unit. In this fashion, the information in the map specifies a number of read units to access in storage device 195 to retrieve the logical page.

It should be noted that term "subsequent" read unit 413 does not necessarily imply a numerically sequential read unit address 323. Generally, the storage space of a read unit address 323 is monotonic, but "holes" could exist due to bad blocks in the storage device 195 (e.g., due to wear of the storage device). Thus, any two sequential read units 413 may be separated by one or multiple read unit addresses 323. Additionally, while a read unit address 323 identifies a last of the read units 413 of a mapping unit, the NISR bits 628 may be inverted or interpreted from a last read unit 413 towards a first read unit 413. It should also be noted that the size of any mapping unit herein may vary according to the storage space requirements of the host LBA. Accordingly, the invention is not intended be limited number of read units 413 or any particular length of the read units 325.

What is claimed is:

1. A method of reading a logical page from a non-volatile memory, comprising:
   determining a respective one of a plurality of entries of a map associated with a logical page address of the logical page,
   wherein the logical page address is in a logical block address space,
   wherein each of the entries comprises a respective address of one of a plurality of read units in the non-volatile memory, a respective plurality of lengths in read units, and a respective one or more spanning indications, and
   wherein each of the read units corresponds to an individually correctable portion of the non-volatile memory;
   reading a number of the read units according to the respective plurality of lengths in read units and the respective one or more spanning indications of the respective entry;
   decoding each of the read units in the number of the read units;
   extracting from the decoded read units, according to the respective plurality of lengths in read units and the respective one or more spanning indications of the respective entry, a respective variable-sized piece of data for each of the respective lengths in read units; and decompressing the variable-sized pieces of data to reconstruct the logical page.

2. The method of claim 1, wherein:
at least one of the read units in the number of the read units contains at least portions of two of the variable-sized pieces of data.

3. The method of claim 1, wherein:
the number of the read units is less than a count of the respective plurality of lengths.

4. The method of claim 1, wherein:
each of the read units comprises a respective number of user data bytes and a respective number of error correction code check bytes.

5. The method of claim 4, wherein:
a first one of the read units has a first respective number of user data bytes;
a second one of the read units has a second respective number of user data bytes; and
the first number of user data bytes is different from the second number of user data bytes.

6. The method of claim 1, wherein:
the number of the read units is equal to a sum of the respective plurality of lengths, plus a sum of the respective one or more spanning indications, minus a count of the respective plurality of lengths, plus one.

7. The method of claim 1, wherein:
a count of the respective one or more spanning indications is one less than a count of the respective plurality of lengths.

8. The method of claim 1, wherein:
the logical page is a first logical page;
the logical page address is a first logical page address;
the read units in the number of the read units comprise both all data of the first logical page and at least a portion of data of a second logical page at a second logical page address; and
the second logical page address is different from the first logical page address.

9. A method, comprising:
first mapping each of a plurality of pages in a storage address space to a respective address of one of a plurality of smallest quantities of correctable data readable from a non-volatile memory, wherein each of the pages are stored in the non-volatile memory as a respective plurality of variable-sized pieces;
second mapping each of the pages to a respective plurality of spans, each of the respective spans specifying an integer number of the smallest quantities of correctable data readable from the non-volatile memory;
third mapping each of the pages to a respective one or more next indications;
first determining particular ones of the smallest quantities of correctable data readable from the non-volatile memory to access to retrieve a particular one of the pages according to results of the first mapping, results of the second mapping, and results of the third mapping; and
second determining which ones of the particular smallest quantities of correctable data readable from the non-volatile memory store data of each of the respective plurality of variable-sized pieces of the particular page according to results of the second mapping and results of the third mapping.

10. The method of claim 9, further comprising:
in response to a read command to retrieve the particular page, retrieving solely a portion of the non-volatile memory corresponding to the particular smallest quantities of correctable data readable from the non-volatile memory.

11. The method of claim 9, wherein:
one of the smallest quantities of correctable data readable from the non-volatile memory specified by the respective address, the respective spans, and the respective next indications of the particular page contemporaneously stores data of the particular page and data of a different one of the pages.

12. The method of claim 9, further comprising:
fourth mapping each of the pages to a respective length specifying a length of the respective plurality of variable-sized pieces.

13. The method of claim 12 wherein:
the respective length is in units having a finer granularity than the smallest quantity of correctable data readable from the non-volatile memory.

14. The method of claim 13, wherein:
the respective length is in units having a coarser granularity than byte granularity.

15. The method of claim 9, further comprising:
accessing a map comprising a plurality of map entries according to an address in the storage address space of the particular page to look up a respective map entry associated with the particular page,
wherein the respective map entry comprises the respective address, the respective spans, and the respective next indications of the particular page.

16. The method of claim 15, wherein:
the map has one entry for each of the pages.

17. The method of claim 15, wherein:
the accessing the map comprises the first mapping, the second mapping, and the third mapping.

18. A storage device, comprising:
a non-volatile memory operable to store data; and
a controller operable to determine a respective one of a plurality of entries of a map associated with a logical page address of the logical page,
wherein the logical page address is in a logical block address space,
wherein each of the entries comprises a respective address of one of a plurality of read units in the non-volatile memory, a respective plurality of lengths in read units, and a respective one or more spanning indications,
wherein each of the read units corresponds to an individually correctable portion of the non-volatile memory, and
wherein the controller is further operable to:
read a number of the read units according to the respective plurality of lengths in read units and the respective one or more spanning indications of the respective entry;
decode each of the read units in the number of the read units;
extract from the decoded read units, according to the respective plurality of lengths in read units and the respective one or more spanning indications of the respective entry, a respective variable-sized piece of data for each of the respective lengths in read units; and
decompress the variable-sized pieces of data to reconstruct the logical page.

19. The storage device of claim 18, wherein:
at least one of the read units in the number of the read units contains at least portions of two of the variable-sized pieces of data.

20. The storage device of claim 18, wherein:
the number of the read units is less than a count of the respective plurality of lengths.

21. The storage device of claim 18, wherein:
each of the read units comprises a respective number of user data bytes and a respective number of error correction code check bytes.

22. The storage device of claim 21, wherein:
a first one of the read units has a first respective number of user data bytes, and a second one of the read units has a second respective number of user data bytes, the first number of user data bytes different from the second number of user data bytes.

\* \* \* \* \*